Sept. 11, 1962 R. A. GRAMMER, JR., ETAL 3,053,985

PHOTOCELL CIRCUITS

Filed Aug. 3, 1959

Reynold A. Grammer, Jr.
William Modney
INVENTORS

BY R. Frank Smith
Robert W. Hampton
ATTORNEYS

United States Patent Office 3,053,985

Patented Sept. 11, 1962

3,053,985

PHOTOCELL CIRCUITS

Reynold A. Grammer, Jr., and William Modney, Rochester, N.Y., assignors to Eastman Kodak Company, Rochester, N.Y., a corporation of New Jersey Filed Aug. 3, 1959, Ser. No. 831,112
6 Claims. (Cl. 250—212)

The present invention relates to photocell circuits and more particularly to the use of a photovoltaic, or barrier layer cell, in an operational amplifier resistive feedback circuit for measuring illumination, or in an operational amplifier with capacitive feedback circuit to obtain a photocell actuated timing circuit for use in a photographic printer or enlarger.

The photovoltaic cell is well known in the art to be highly stable and relatively unaffected by atmospheric conditions. In addition, the usual application of the photovoltaic cell is in a low impedance load circuit, so that it has become familiarly known as a low impedance device. This characteristic is valuable in that when so used, the photovoltaic cell is relatively insensitive, as compared with the vacuum photocell for example, to electrical leakage between terminals, caused by dirt or moisture.

When a photovoltaic cell is connected to a load resistor whose value exceeds approximately 100 ohms, and then exposed to light levels above a few foot-candles, the output of the cell departs markedly from linearity. When the cell is connected to an open circuit this non-linearity becomes acute, and in such a circuit it is usually convenient to operate photovoltaic cells at a constant light level, so that the non-linearities are of no importance as long as balance at the selected operating level can be maintained. When the cell output is connected to a very low impedance, for example 100 ohms, the voltage typically developed at a light level of 20 foot candles is very low, approximately 0.004 volt. While a number of cells can be used together to increase the output, the inconvenience and cost of this method generally argues against its use.

It is therefore a primary object of the invention to linearize and maximize the output of a photovoltaic cell into a high impedance circuit, by interposing a device which presents an effective low impedance load to the cell.

The circuit described herein is intended to make use of the advantages of a photovoltaic cell without requiring it to be loaded by a low value ohmic resistor, and yet preserving, maintaining or surpassing the linearity usually obtained in this manner. The circuit consists of a cell, a suitably stabilized very-high-gain D.-C. amplifier, and a feedback impedance. The D.-C. amplifier can be an amplifier used for computing purposes, known as an operational amplifier, and it is desirable that the gain of this amplifier exceed $10^4$. The amplifier described in connection with the accompanying circuit diagrams has a gain of $10^8$, and is of the "chopper stabilized" type. The feedback impedance may consist of an ohmic resistor or a capacitor, depending upon the nature of the output required.

Another object of the invention is to employ a photovoltaic cell in an operational amplifier with a resistive feedback circuit to measure illumination.

A further object is to employ a photovoltaic cell in an operational amplifier with a capacitive feedback circuit as a part of a timing circuit.

Another object is to use a high-gain operational amplifier to produce a voltage in opposition to a photocell voltage, in order to cancel the voltage drop across the cell's internal resistance and thereby reduce the effective load resistance on the cell to substantially zero.

Other objects of the invention will appear from the following description, reference being made to the accompanying drawings, wherein.

Figure 1:
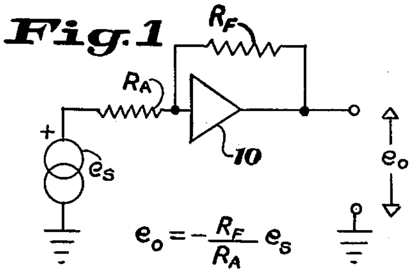
FIG. 1 is a schematic wiring diagram of an operational amplifier having a resistive feedback impedance.
Figure 2:
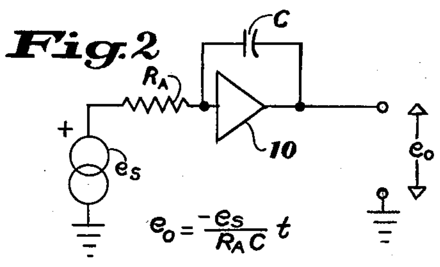
FIG. 2 is a schematic wiring diagram of an operational amplifier having a capacitive feedback impedance.
Figure 3:
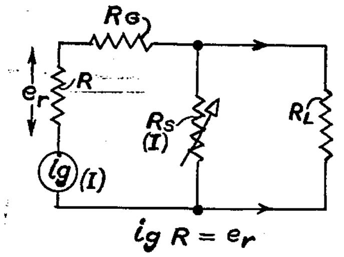
FIG. 3 is a schematic diagram of an equivalent circuit for the photovoltaic cell.
Figure 4:
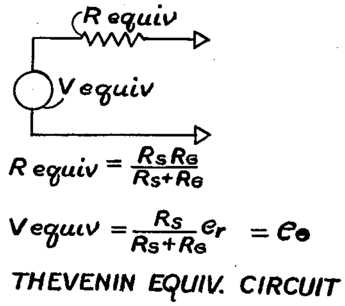
FIG. 4 is a schematic diagram of the Thevenin equivalent circuit of the photocell.

In order to develope the theory of operation of a circuit embodying the present invention it is necessary to postulate the operational amplifier equations known in the art. (Cf. Ragazzini, Randall, and Russell, Analysis of Problems in Dynamics by Electronic Circuits, I.R.E. Proc., May 1947.) Namely, with reference to FIG. 1, the output voltage $e_o$ of an operational amplifier is $-(R_F/R_A)e_s$ for resistive feedback, and in FIG. 2, $e_o=-(t/R_AC)e_s$ for capacitive feedback, where $e_s$ is the source voltage, $R_A$ is the series resistance, $R_F$ is the feedback resistance, $t$ is time and C is the feedback capacitance, in parallel with an amplifier 10. An amplifier which is suitable for use without modification in circuits described in this specification is the Model USA-3 Universal stabilized amplifier, manufactured by George A. Philbrick Researches, Inc. Further, it is desirable to express the equivalent circuit of the photovoltaic cell as shown in FIG. 3, as a current generator $i_g$ developing a voltage $e_r$ across a fixed resistance R, and in addition a series resistor $R_G$ and a shunt resistor $R_S$ in parallel with the external load $R_L$. Current $i_g$ and resistance $R_S$ vary with illumination (I). Specifically, $R_S$ is proportional to the inverse of illumination whereas $i_g$ is directly proportional. It can be seen that this equivalent circuit will explain why moderate values of load resistor result in nonlinear output at high light levels, since the value of $R_S$ begins to take an appreciable amount of the current shared by the parallel combination of load $R_L$ and $R_S$. If $R_L$ is always low compared to $R_S$, the latter resistance does not conduct appreciable current compared to that of $R_L$ and a substantially linear variation of current in $R_L$ occurs. It is seen that an increase in illumination increases the value of $i_g$ substantially linearly, according to this model, and hence increases the voltage $e_r$ substantially linearly. If the circuit of FIG. 3 is reduced by Thevenin's theorem to that of FIG. 4 and the equivalent voltage source and source resistance used for the input of an operational amplifier, the output voltage of the amplifier for a resistive feedback can be shown to be independent of the value of $R_S$ to a very small error, with the result that the output is almost exactly given by: $e_o=-(R_F/R_G)e_r$. For capacitive feedback the output voltage is given by: $e_o=-e_rt/R_GC$.

Figure 5:
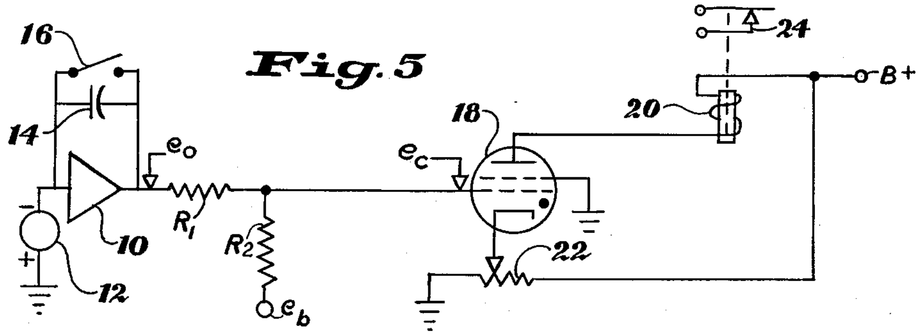
FIG. 5 is a schematic wiring diagram of a first embodiment of the invention, employed as a timing circuit.

When connected in a circuit with capacitive feedback, as described above, the timing circuit equation $t=K/I$ (time proportional to the reciprocal of illumination on the cell) is established, if a suitable level detector such as a thyratron, vacuum tube trigger, or transistor trigger is used to detect the output voltage in some manner such as shown in FIG. 5. In this circuit a bias voltage is summed in the network $R_1R_2$, such that overcoming the bias voltage by the integrating amplifier output, proportional to illumination, results in triggering of the thyratron or other trigger-tube voltage amplitude detector.

The circuit consists of a photovoltaic cell 12, a high gain direct current amplifier 10, a feedback capacitor 14 having a typical value of one microfarad, a capacitor discharging switch 16, a summing network consisting of resistors $R_1$, $R_2$ and a typical thyratron trigger 18 with a relay 20 in its anode circuit, and means such as a potentiometer 22 for adjusting the cathode potential of the thyratron.

The action of the thyratron trigger is as a conventional level detector. By adjusting the cathode bias potential, the control grid potential $e_c$, at which the thyratron breaks down and begins to conduct can be adjusted to a convenient level; this level can be chosen to be zero volts with respect to ground.

The summing network, chosen for simplicity to consist of equal resistors $R_1$ and $R_2$, typically of one megohm resistance each, when connected to an amplifier output voltage $e_o$ and a negative bias potential of magnitude $e_b$ causes the potential of $e_c$ to be equal to $$\frac{e_o-e_b}{2}$$

The operation of the photocell direct current amplifier and feedback capacitor have been previously described. If at time $t=0$, the capacitor discharging switch 16 is opened, then the amplifier output voltage increase according to $$e_o=-[e_r]\frac{t}{R_GC}=e_r\frac{t}{R_GC}$$

Substituting:

$$e_c=\frac{e_o-e_b}{2}=\frac{e_r\frac{t}{R_GC}-e_b}{2}$$

If the thyratron triggers at $e_c=0$, $$e_r\frac{t}{R_GC}=e_b$$

$$t=\frac{R_GCe_b}{e_r}$$

Since $e_r$ is proportional to illumination, I, the time, $t$, of triggering is proportional to the reciprocal of illumination, $$t=\frac{K_1}{I}$$

Such a circuit can be used to open or close a switch 24 under control of relay 20, thereby to time photographic exposures, for example, where it is desired that the product of time and illumination remain constant.

Figure 6:
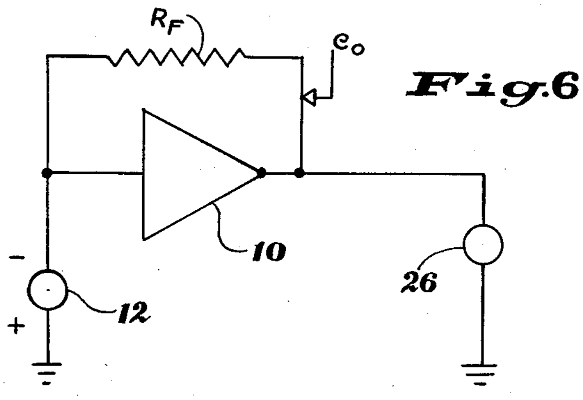
FIG. 6 is a schematic wiring diagram of a second embodiment of the invention, employed as an illumination measuring circut.

If the feedback impedance is a resistor, as shown in FIG. 6, the output of the photovoltaic cell 12 and D.-C. amplifier 10, with operational feedback, may be connected to a D.-C. voltmeter 26 to comprise a direct-reading photometer whose indication is a substantially linear voltage reading with respect to illumination on the photocell.

The output of the amplifier in this case is given by $$e_o=[-e_r]\frac{R_F}{R_G}=\frac{R_F}{R_G}e_r$$

where $R_F$=feedback resistor $R_G$=internal cell impedance $e_r$=internal cell generated voltage Since $e_r$ is proportional to illumination, I, the voltmeter 26 will read a voltage $$e_o=\frac{R_F}{R_G}e_r=K_2I$$

where $K_2$ is a constant.

The invention has been described in detail with particular reference to preferred embodiments thereof, but it will be understood that variations and modifications can be effected within the spirit and scope of the invention as described hereinabove and as defined in the appended claims.

We claim:

1. A photocell amplifying circuit comprising, in combination: a two-terminal photovoltaic cell having an output terminal and adapted to receive light and to generate on said output terminal an electrical signal having a characteristic which is a function of the intensity of said light; a direct-current operational amplifier constituting a load resistance on said photovoltaic cell and having an input terminal connected to the ouput terminal of said cell and having an output terminal; and a direct-current feedback circuit interconnecting the output and input terminals of said amplifier for reducing substantially to zero the effective load resistance of said amplifier on said photovoltaic cell.

2. The amplifying circuit defined in claim 1, wherein said amplifier has a gain of at least $10^4$.

3. The amplifying circuit defined in claim 1, wherein said feedback circuit comprises a capacitor.

4. The amplifying circuit defined in claim 3, with: a shorting circuit connected in parallel with said capacitor; means for opening said shorting circuit; a level detector having first and second states of operation and having an input terminal and an output terminal; means connecting the output terminal of said amplifier to the input terminal of said detector for reversing the operating state of said detector in response to the application of a predetermined signal to its input terminal by said amplifier; a control device connected to the output terminal of said detector and having first and second states of operation, the operating state of said control device being reversed in response to said reversal of the operating state of said detector.

5. The amplifying circuit defined in claim 1, wherein said feedback circuit comprises a resistor.

6. The amplifying circuit defined in claim 5, with an electrical measuring instrument connected to the output terminal of said amplifier and energized thereby as a function of the intensity of said light.

References Cited in the file of this patent

UNITED STATES PATENTS

| | | |
|---|---|---|
| 2,576,661 | Wouters | Nov. 27, 1951 |
| 2,796,533 | Morton et al. | June 18, 1957 |
| 2,948,815 | Willems et al. | Aug. 9, 1960 |

OTHER REFERENCES

Korn & Korn: Electronic Analog Computers; McGraw-Hill Book Co., Inc.; 1952 (pp. 137–145).

Ragazzini et al.: Proceedings of the I.R.E.; vol. 35; May 1947, pp. 444–452.

Turner, Rufus P.: Semiconductor Devices; 1961; Holt, Rinehart & Winston, Inc., New York; chapt. 6. (Copy in Scientific Library.)